United States Patent
Avidan et al.

(10) Patent No.: US 8,407,650 B1
(45) Date of Patent: Mar. 26, 2013

(54) METHOD FOR REPEATED BLOCK MODIFICATION FOR CHIP ROUTING

(75) Inventors: Jacob Avidan, Los Altos, CA (US); Sandeep Grover, Sunnyvale, CA (US); Roger Carpenter, Palo Alto, CA (US); Philippe Sarrazin, San Jose, CA (US)

(73) Assignee: Synopsis, Inc., Mountain View, CA (US)

(*) Notice: Subject to any disclaimer, the term of this patent is extended or adjusted under 35 U.S.C. 154(b) by 645 days.

(21) Appl. No.: 12/129,916

(22) Filed: May 30, 2008

Related U.S. Application Data

(60) Provisional application No. 60/941,635, filed on Jun. 1, 2007.

(51) Int. Cl.
*G06F 17/50* (2006.01)
(52) U.S. Cl. .................. 716/129; 716/126
(58) Field of Classification Search ............. 716/119, 716/122, 126, 129, 130
See application file for complete search history.

(56) References Cited

U.S. PATENT DOCUMENTS

| | | | |
|---|---|---|---|
| 5,514,884 A | 5/1996 | Hively et al. | |
| 5,995,735 A * | 11/1999 | Le | 716/13 |
| 6,110,221 A * | 8/2000 | Pai et al. | 716/8 |
| 6,346,826 B1 | 2/2002 | Chapman et al. | |
| 2002/0129326 A1* | 9/2002 | Nuber et al. | 716/12 |

* cited by examiner

*Primary Examiner* — Vuthe Siek
(74) *Attorney, Agent, or Firm* — Kilpatrick Townsend & Stockton LLP

(57) ABSTRACT

In various embodiments, each possible different instance of a repeated block can be concurrently modified for chip routing. Repeated blocks can be implemented where all instances of a repeated block are identical or substantially identical. Pin placement may be determined based on analysis of the I/O for all instances. The pin placement may be generated to be identical or substantially similar for all instances. Flyover blockages can be designed into repeated blocks to enable the global router to wire through the repeated block. Buffers and associated pins can be inserted into repeated block within the flyover space where the global router wires to the needed buffer through area pins.

18 Claims, 11 Drawing Sheets

METHOD FOR REPEATED BLOCK MODIFICATION FOR CHIP ROUTING

CROSS-REFERENCES TO RELATED APPLICATIONS

This applications claims the benefit of and priority to U.S. Provisional Patent Application No. 60/941,635, filed Jun. 1, 2007 and entitled "Method for Repeated Block Modification for Chip Routing," the entire disclosure of which is herein incorporated by reference for all purposes.

BACKGROUND OF THE INVENTION

This disclosure relates generally to the field of chip design. More particularly, this disclosure relates to techniques for modifying repeated blocks for chip routing.

Semiconductor chips can be composed of complex electronic circuit arrangements. With each progressive generation of semiconductor technology, the number of components on a single chip can go up exponentially. The number of devices on a chip, as well as their close proximity, may drive significant effort in analysis. One key aspect of circuit design can involve the routing of signal to blocks and the routing of other signals over blocks. Due to the shear number of elements on a chip, and the fact that many of the blocks have become quite large, the routing issues can be challenging. Another key aspect of circuit design may involve implementing the layout of all the devices on chip. The relative placement of the devices may drive significant computation resources, as each cell must be selected, placed, and routed to across the entire chip.

Often times, a soft macro or block can be implemented more than once on chip. These multiple instances can be referred to as repeated blocks. If each instance of a repeated block is implemented independently, then the different timing and layout optimizations may cause the instances to be different. These differences may cause the implementation calculations to be redone for each instance of a repeated block. For example, the calculation for placement of cells within a block may be repeated for each repeated block instance. In addition, the calculation for placement of buffers for handling signals routed through each block may also be repeated for each instance of the repeated block. All of these calculations can require computing resources and time, which is a significant concern as chips become larger and more complex.

Furthermore, if the instances of a repeated block are all implemented independently, the differences can create debug problems, as each instance likely will have different properties. With independent implementation there may actually be problems where one instance would work and another instance would not work properly. Additionally, differences between instances of repeated blocks can also be problematic whenever a modification is required in a repeated block. A modification, also often referred to as an Engineering Change Order (ECO), likely must be implemented on each and every instance. Moreover, verification also can become a problem for repeated blocks, since each verification step likely must be repeated on each instance.

Accordingly, what is desired are improved methods and apparatus for solving some of the problems discussed above. Additionally, what is desired are improved methods and apparatus for reducing some of the drawbacks discussed above.

BRIEF SUMMARY OF THE INVENTION

Systems and methods can be provided for repeated block modification for chip routing. Elements of an integrated circuit, such as soft macros, may be implemented more than once as repeated blocks. Each instance of a repeated block may include different timing and layout optimizations that cause the instances to be initially different. In various embodiments, each possible different instance of a repeated block can be concurrently optimized for chip routing.

In various embodiments, repeated blocks can be implemented where all instances of a repeated block are identical or substantially identical. Pin placement may be determined based on analysis of the I/O for all instances. The pin placement may be generated to be identical or substantially similar for all instances. Flyover blockages can be designed into repeated blocks to enable the global router to wire through the repeated block. Buffers and associated pins can be inserted into repeated block within the flyover space where the global router wires to the needed buffer through area pins.

In some embodiments, pin placement for repeated blocks may be performed where all nodes that all repeated block instances contact are superimposed. A Minimum Spanning Tree (MST) analysis may be performed on these nodes to generate a minimum spanning tree representing connections to the nodes. I/O pins may be placed based on the connections. In one embodiment, an I/O pin may be placed in the same location on all repeated block instances.

In further embodiments, flyover implementation for repeated blocks may be performed based on global routing requirements. Flyover blockages may be formed above a repeated block. The flyover blockages then may be pushed down into the repeated block. A wire may be globally routed through the flyover blockage.

In yet further embodiments, buffer insertion for repeated blocks may be performed. Needed buffering distance may be determined along a globally routed wire. Buffers may be inserted in a repeated block within a flyover space reserved based on global routing requirements. A global router then may wire to inserted buffers through the flyover space. In one embodiment, the global router may wire to the inserted buffers through area pins. Unused buffers may be tied off in a repeated block instance.

A further understanding of the nature and the advantages of the inventions disclosed herein may be realized by reference of the remaining portions of the specification and the attached drawings.

BRIEF DESCRIPTION OF THE DRAWINGS

In order to better describe and illustrate embodiments and/or examples of those inventions disclosed herein, reference may be made to one or more accompanying drawings.

The additional details or examples used to describe the accompanying drawings should not be considered as limitations to the scope of any of the disclosed inventions, the presently described embodiments and/or examples, and the presently understood best mode of these inventions.

DETAILED DESCRIPTION OF THE INVENTION

In various embodiments, a soft macro or block can be implemented more than once on chip as repeated blocks. Each instance of a repeated block can be implemented taking into account the different timing and layout optimizations that cause the instances to be different.

Moreover, design implementation calculations may be performed simultaneously considering all instances of a repeated block, performing all of the analysis for routing signals to and through repeated block instances at the same time. Each instance may be in a slightly different environment, with differing fan-in and fan-out cones, global routing requirements, and buffering requirements. Thus, in some embodiments, a single design may be implemented which meets all of the interface requirements.

There are several concepts or terms involved in routing signals to or over block instance. The term "pin" can refer to any interface signal on a block where an input or output of the block may be wired to the pin as a contact point. The term "flyover" can describe a blockage in a metal level over a repeated block that allows a global router to wire over a block where the wire does not contact any logic in the block. A flyover signal (i.e., a globally routed signal line in the flyover space) may be routed from one side of a block through to another side of the block so that it can connect two portions of logic, neither or which may be inside the block of interest. A "buffer" can describe an inverter or pair of inverters used to help drive a signal that has to travel a long distance. The buffer may re-drive the signal and can be placed somewhere in the middle of a signal wire that is being driven a long distance. A buffer may be placed in the middle of a block to re-drive signals that cross that block. The buffer can maintain crisp signal waveforms and improve timing delays. The buffer may not interact with other logic or signals in the block, but may re-drive a signal traversing the block.

Figure 1:
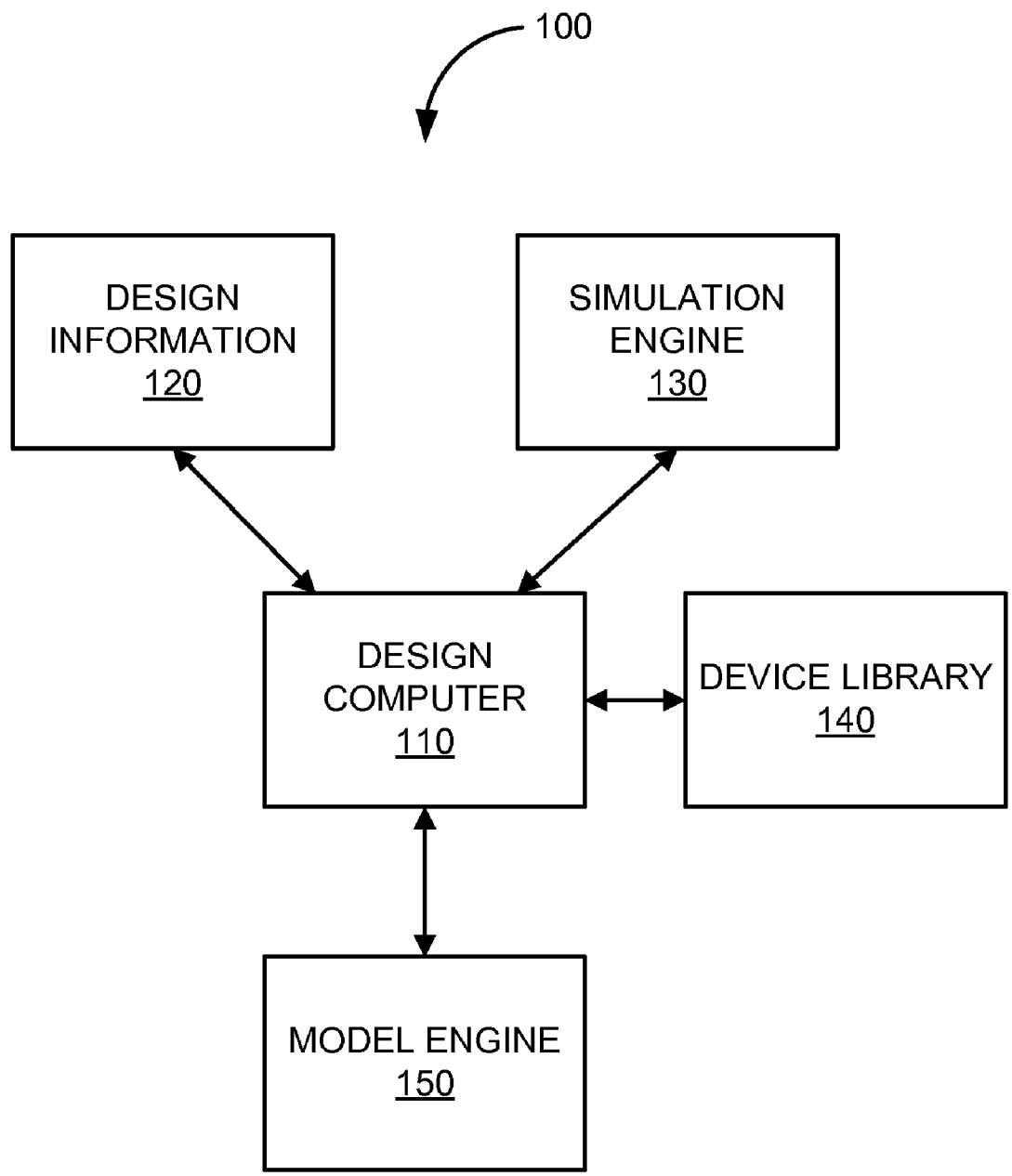
FIG. 1 is a simplified block diagram of an electronic design automation system that may be used to perform repeated block timing analysis in one embodiment of the present invention.

FIG. 1 is a simplified block diagram of electronic design automation (EDA) system 100 that may be used to perform repeated block timing analysis in one embodiment of the present invention. System 100 can include design computer 110 coupled to design information 120, simulation engine 130, device library 140, and model engine 150.

In various embodiments, a user may interact with or otherwise use design computer 110 to design and produce electronic systems ranging from printed circuit boards (PCBs) to integrated circuits. The user may use design computer 110 (along with design information 120, simulation engine 130, device library 140, and model engine 150) of system 100 to perform co-design and architecture of packages and integrated circuits.

In some embodiments, the user may interact with or otherwise use design computer 110 to perform design tasks, such as floorplanning, placement, routing, or other steps for creating an integrated circuit. In one embodiment, a design may be created showing the expected locations for gates, power and ground planes, I/O pads, soft/hard macros, blocks, or the like.

System 100 may perform logic synthesis, such as the translation of a chip's abstract, logical RTL-description into a discrete netlist of logic-gate (Boolean-logic) primitives.

System 100 may simulate a circuit's operation so as to verify correctness and performance. In another example, system 100 provides low-level transistor-simulation of a schematic/layout's behavior. In yet another example, system 100 may provide a digital-simulation of an RTL or gate-netlist's digital behavior. System 100 may further provide a high-level simulation of a design's architectural operation, or employ the use of special purpose hardware to emulate the logic of a proposed design.

In various embodiments, system 100 may include one or more tools to perform repeated block modification for chip routing. System 100 may determine pin placement for an instance of a repeated block. System 100 may further determine a block flyover implementation. System 100 then may insert buffers for signals passing through flyover spaces. System 100 may generate a layout for instances of repeated blocks that includes substantially similar implementations of pin placement, flyover, and buffering of each repeated block in the design.

Figure 2:
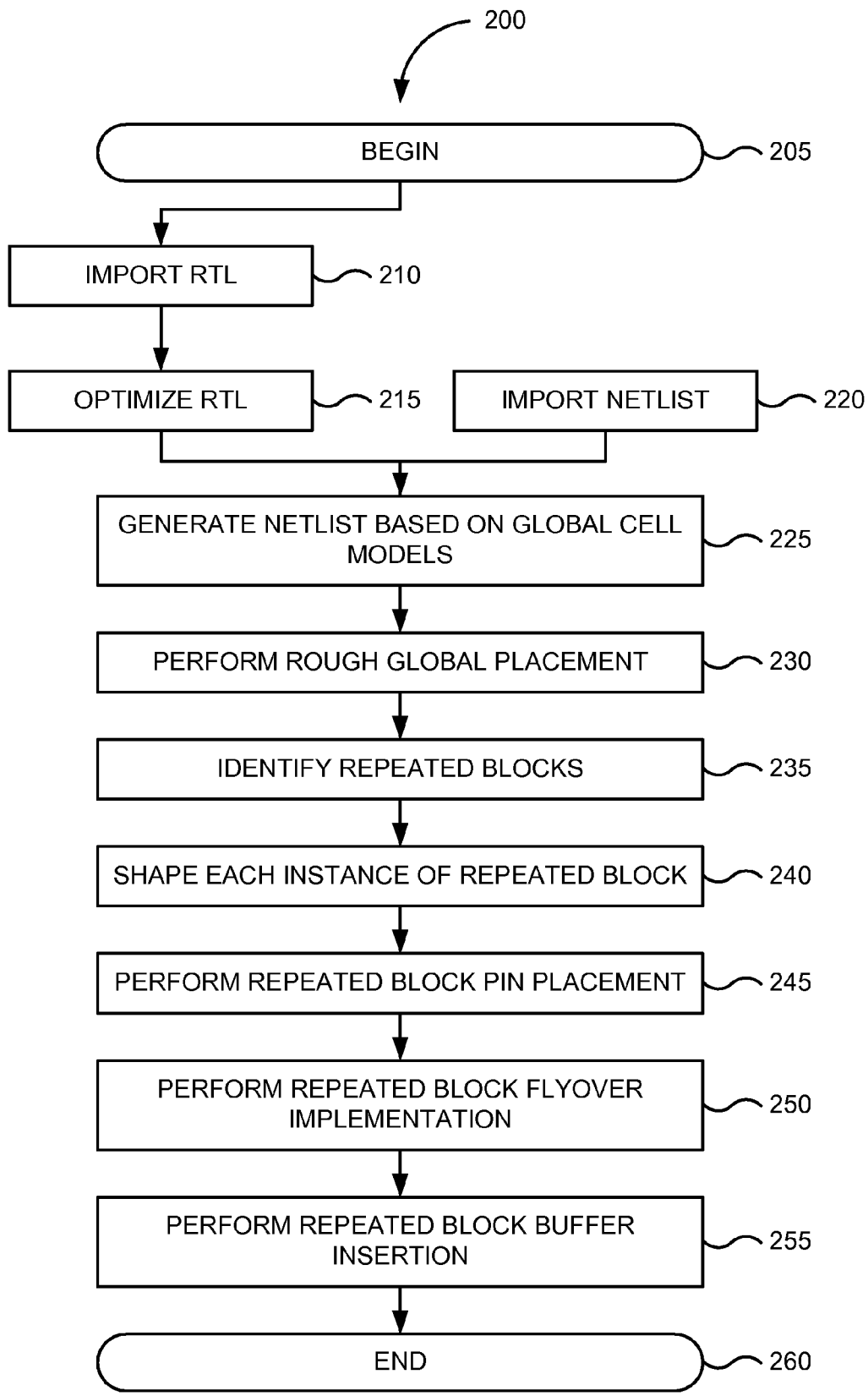
FIG. 2 is a simplified flowchart of a method for repeated block modification for chip routing in one embodiment according to the present invention.

FIG. 2 is a simplified flowchart of method 200 for repeated block modification for chip routing in one embodiment according to the present invention. The processing depicted in FIG. 2 may be performed by software modules (e.g., instructions or code) executed by a processor of a computer system, by hardware modules of the computer system, or combinations thereof. FIG. 2 begins in step 205.

In step 210, a Register Transfer Level (RTL) specification is imported. The RTL specification may define one or more digital circuits as a collection of registers, Boolean equations, control logic (such as "if-then-else" statements), as well as complex event sequences. Some examples of RTL languages are VHDL and Verilog. In step 215, the RTL specification is optimized. The RTL specification may be turned into a design in one or more gate-level netlists. In some embodiments, this step may be referred to as "fix rtl." Alternatively, in step 220, a netlist is imported.

In step 225, a netlist is generated based on global cell models. In some embodiments, this step may be referred to as "fix netlist." For example, the RTL specification may be turned into a netlist based on the global cell models. In another example, the imported netlist may be modified based on the global cell models. The netlist may include connectivity information, instances, nets, and/or attributes.

In step 230, a rough global placement is performed. System 100 may place all of the cells on a chip in approximately the best locations. These placed cells may then be used for further analysis. At this point, any repeated blocks within a design may be identified.

Figure 3:
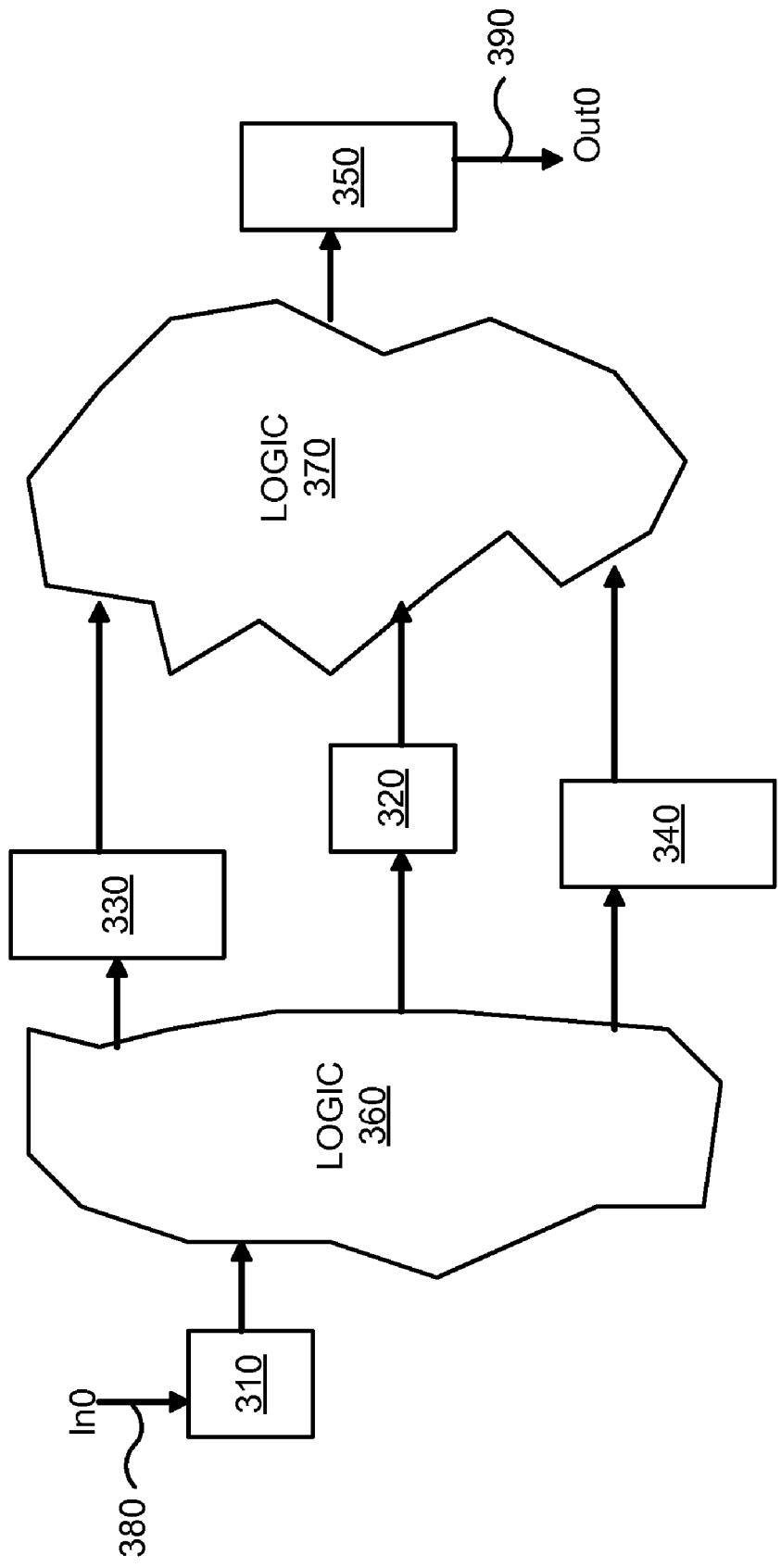
FIG. 3 is a logic diagram of repeated blocks and surrounding logic on an integrated circuit in one embodiment according to the present invention.

FIG. 3 is a logic diagram of repeated blocks and surrounding logic on an integrated circuit in one embodiment according to the present invention. In this example, blocks 310 and 320 can include instances of one repeated block. In other words, blocks 310 and 320 represent instances of the same macro, cell, etc. Blocks 330, 340, and 350 can include instances of another repeated block. Logic 360 and logic 370 may include other on-chip logic. This other on-chip logic may include combinational logic and/or sequential logic.

It is likely signals being wired to and from block 310 would have different lengths and approach directions for those signal wires interfacing with block 320. The point at which an input or output signal contacts a block may commonly be referred to as a "pin."

Figure 4:
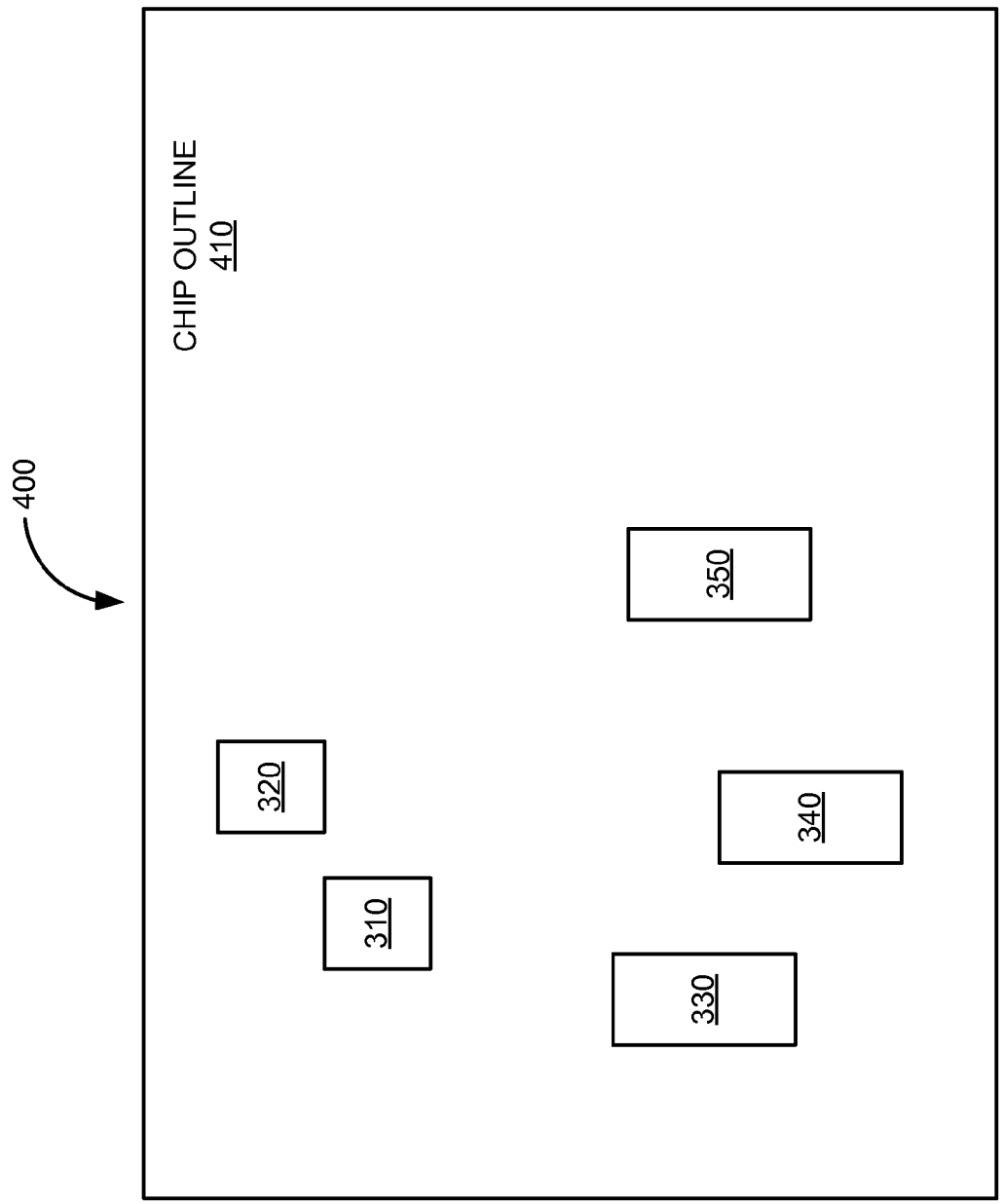
FIG. 4 is an illustration of a chip layout representation for a possible repeat block placement in one embodiment according to the present invention.

FIG. 4 is an illustration of chip layout representation 400 for a possible repeated block placement in one embodiment according to the present invention. Chip layout representation 400 includes chip outline 410. Chip outline 410 may enclose one or more instances of repeated blocks (e.g., blocks 310 and 320, as well as blocks 330, 340, and 350 of FIG. 3). Due to differing placement of repeated blocks 330, 340, and 350, for example, the routing of signals through each block likely would be different. These different through routings may include differing number of flyover signals as well as differing flyover paths.

Referring again to FIG. 2, in step 235, repeated blocks are identified. System 100 may determine where repeated blocks are implemented, and group all of the cells for each instance of the repeated block. In step 240, repeated blocks are shaped. Instances of repeated blocks may be shaped to include identical or substantially identical implementations. System 100 may force all of the repeated block instances to have the same outline shape. In one embodiment all of the shapes are rectangular, but other embodiments with non-rectangular shapes are possible. The requirement may be that all instances of the repeated blocks have the same shape. In one embodiment repeated block rotation is allowed, although the rotated shape may be the same.

In step 245, repeated blocks pin placement is performed. System 100 may perform pin placement to implement identical designs for instance of a repeated block which properly handles all of the interface requirements for each instance of a repeated block. In various embodiments, identical or substantially identical repeated block instance designs can thus have all of their pins in identical or similar locations. One example of a method for repeated block pin placement is discussed further with respect to FIG. 5.

In step 250, repeated block flyover implementation is performed. System 100 may generate flyovers for instances of a repeated block that accommodate global routing needs of all instances of a repeated block. One example of a method for repeated block flyover implementation is described further with respect to FIG. 6.

In step 255, repeated block buffer insertion is performed. System 100 may insert buffers in the flyover space created for each instance of a repeated block. One example of a method for repeated block buffer insertion is described further with respected to FIG. 10.

In various embodiments, steps 240, 245, and 250 may be performed in any order. Steps 240, 245, and 250 may be performed independently or may be performed based on the results, dependencies, or constraints imposed by prior operations.

Accordingly, system 100 may perform design implementation calculations considering all instances of a repeated block simultaneously. In some embodiments, all of the analysis for routing signals to and through repeated block instances can be performed at the same time. As each instance of a repeated block may include a slightly different environment with differing fan-in and fan-out cones, global routing requirements, and buffering requirements, system 100 may implement a single design which meets all of the interface requirements. FIG. 2 ends in step 260.

Figure 5:
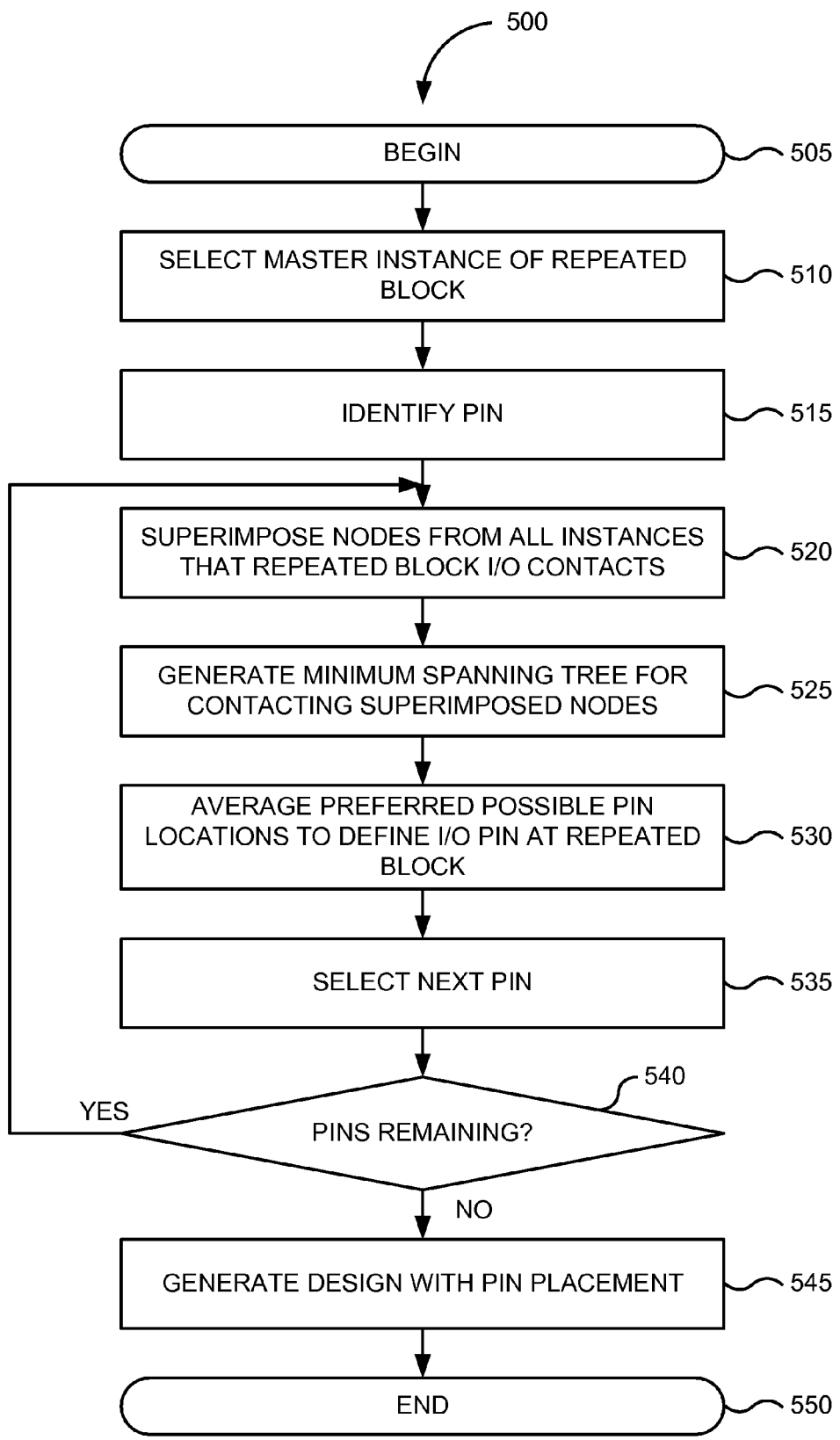
FIG. 5 is a flowchart of a method for pin placement for repeated blocks in one embodiment according to the present invention.

FIG. 5 is a flowchart of a method for pin placement for repeated blocks in one embodiment according to the present invention. Pin placement may be required to define where a block's inputs and outputs occur. Once instances of a repeated block have been identified, pin placement analysis can be performed. FIG. 5 begins in step 505.

In step 510, a master instance of a repeated block is selected. The master instance may be utilized to choose a starting point. In one embodiment, the master instance may be arbitrarily selected. In alternate embodiments, the master instance may be specified by the designer. In another alternate embodiment, the master instance may be determined by selecting the instance with the most critical timing or by some other design parameter heuristic.

In step 515, a pin is identified. In general, each input and output pin can be placed on the master instance. In step 520, all of the nodes from all of the repeated block instances that a block I/O contacts are superimposed for the identified pin.

In step 525, a Minimum Spanning Tree (MST) is generated for contacting superimposed nodes. The MST may be formed connecting, in one embodiment, the center of the repeated block with the superimposed nodes. This may allow a pin to be placed at the boundary of the repeated block at the nearest point to where the line representing a connection crosses the boundary. In another embodiment, the MST may be formed connecting the nodes with the location of the logic inside the block to which the nodes are connected. Again, a pin may be placed at the nearest point possible to where the line crosses the repeated block boundary. If a repeated block has been rotated, the rotation may be considered during superimposing of the node placements.

In step 530, a heuristic is utilized to select the best or optimal pin placement, when multiple possible pin placements result from step 525. In one embodiment, the nearest possible boundary point to the average of the possible pin locations can be selected. In another embodiment, a heuristic may utilized which factors in the most critical instances' timing and give greater weight to the pin locations determined in step 525 for those instances. The defined pin location may consider blockages to ensure that there no pin placement violations occur.

In step 535, the next pin is selected, if any remain. In step 540, a determination is made whether any pins are remaining to be placed. If yes, the processing continues in step 520 for the next selected pin. The process may be repeated for n+m times, where n is the number of input pins and m is the number of output pins on the repeated block. If no, the processing continues in step 545.

In step 545, a design is generated with the determined pin placements. Each input and output pin can be placed on the master instance. In various embodiments, the pin placement for the master instance is used for each instance of a repeated block. Once all of the pin placements have been determined in step 545, FIG. 5 ends in step 550.

Figure 6:
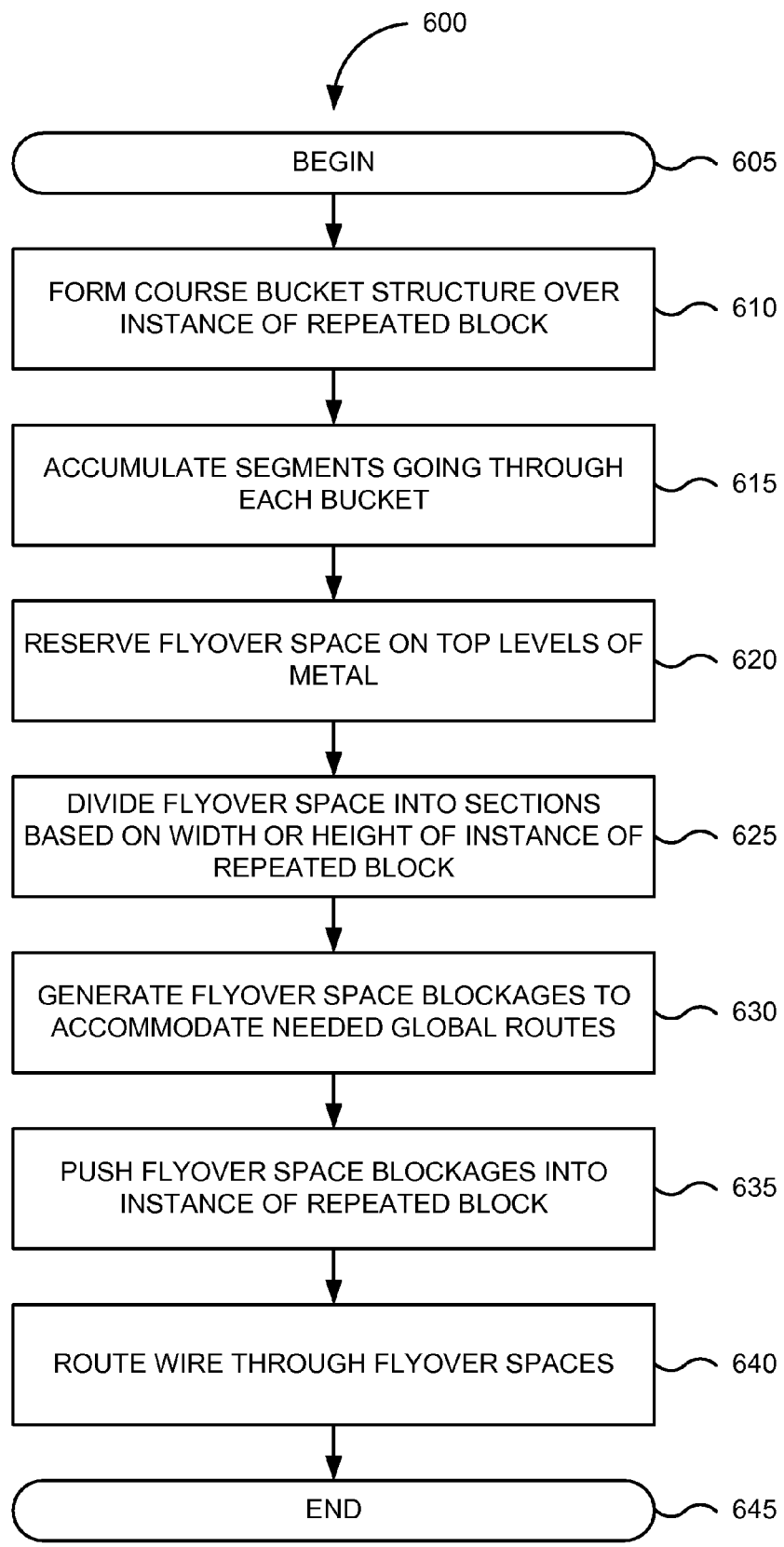
FIG. 6 is a flowchart of a method for block flyover implementation for repeated blocks in one embodiment according to the present invention.

FIG. 6 is a flowchart of a method for block flyover implementation for repeated blocks in one embodiment according to the present invention. In various embodiments, a master instance of a repeated block is selected. The master instance may be the master instance chosen in the repeated block pin placement analysis of FIG. 5. FIG. 6 begins in step 605.

In step 610, a course bucket structure is formed over an instance of a repeated block. For example, a bucket structure may be implemented over the master repeated block instance. In step 615, segments going through each bucket are accumulated. In various embodiments, all of the repeated block instances can be examined, and the global route segments passing through each of the buckets may be accumulated.

In step 620, flyover space on the top levels of metal is reserved. For example, based on the maximum requirement for global routing, flyover space may be reserved on the top two levels of metal over the instance of a repeated block. In step 625, the flyover space is divided into sections based on the height and width of the instance of a repeated block. The required amount of flyover space may also be factored into the number of flyover divisions selected.

In step 630, flyover space blockages are generated to accommodate needed global routes. The flyover blockages may be formed in the upper two levels of metal to accommodate the need global routes. Additionally, the flyover blockages may be designed to avoid power meshes. In step 635, the flyover space blockages are pushed into the instance of a repeated block.

In step 640, wires may be routed through the flyover spaces. In some embodiments, a chip may be routed using a global router where the global router wires signals through the flyover space over the repeated block. FIG. 6 ends in step 645.

Figure 7A:
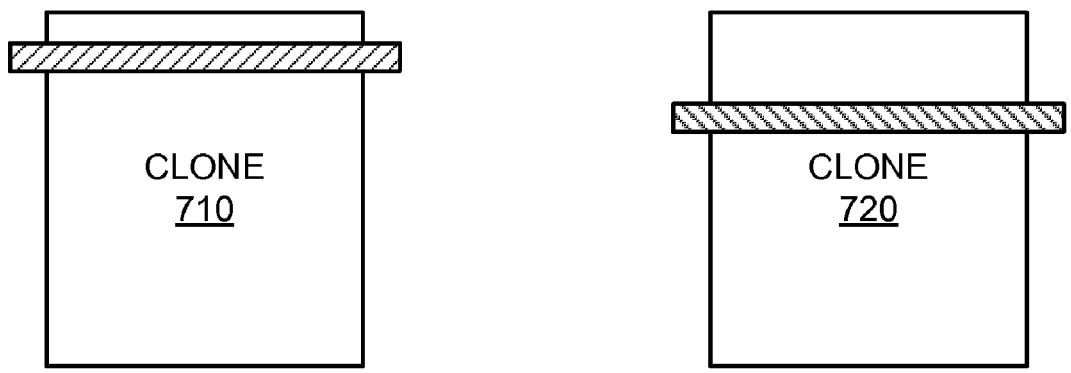
FIGS. 7A and 7B illustrate one method for implementing global routes.
Figure 7B:
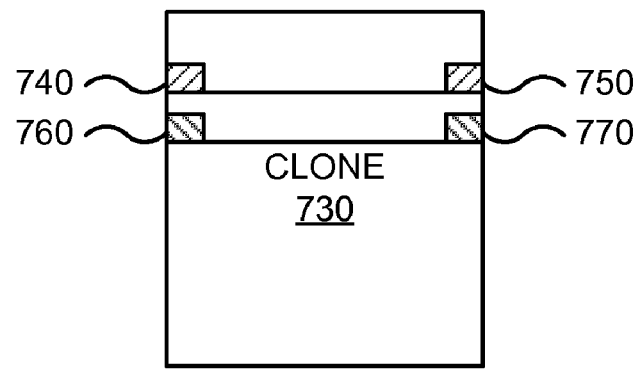

FIGS. 7A and 7B illustrate one method for implementing global routes. A global router may tend to place wires over clone 710 and clone 720 in different locations. For example, clone 710 may include a global route as illustrated by a forward hatch block. Clone 720 may include a global route as illustrated by a backward hatch block.

If both locations are to be included in a single implementation for instances of a repeated block, clone 730 shown in FIG. 7B likely results with both wires being pushed down into the block. For example, clone 730 would include input pin 740 and output pin 750 corresponding to the global route associated with clone 710, and input pin 760 and output pin 770 corresponding to the global route associated with clone 720. When implementing instances of clone 730, one pair of pins may remain unconnected for each instance, resulting in wasting at least two pins and one net resource. This waste can accumulate quickly in complex designs.

Figure 8:
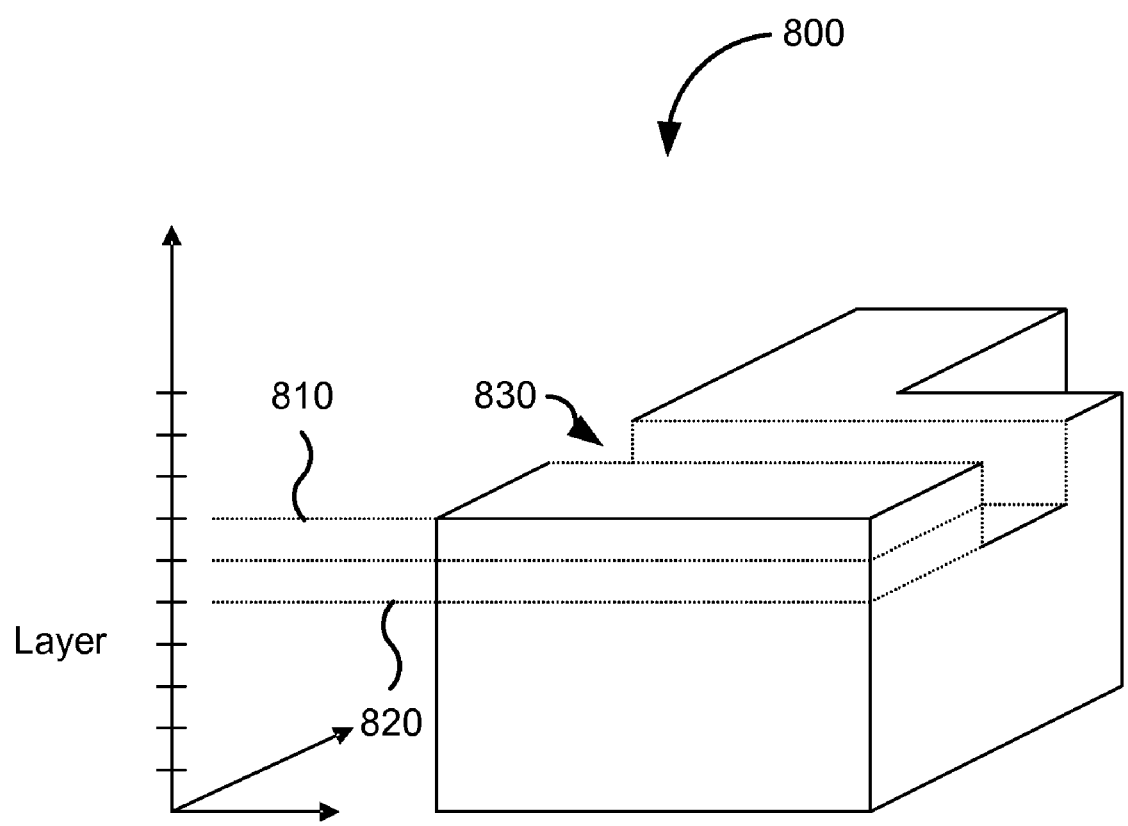
FIG. 8 illustrates block flyover by layer in one embodiment according to the present invention.

Accordingly, in various embodiments, the flyover space can be chosen intelligently based on the global routing needs. FIG. 8 illustrates block flyover by layer in one embodiment according to the present invention. In this example, clone 800 includes one or more layers. Layers 810 and 820 represent top-level metal layers. A cutout area 830 has been made available using method 600 of FIG. 6. Area 830 may be available for top-level routing. Additionally, area 830 may be blocked for block-level routing.

Figure 9:
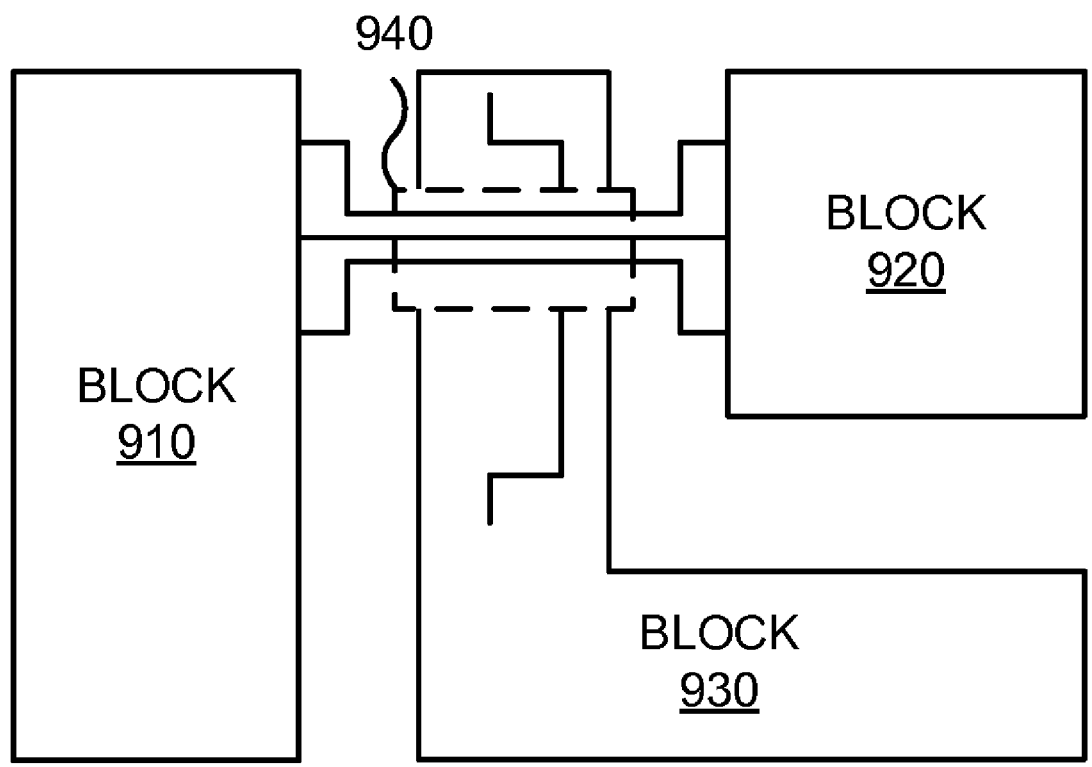
FIG. 9 illustrates block flyover by layer in another embodiment according to the present invention.

FIG. 9 illustrates block flyover by layer in another embodiment according to the present invention. In this example, blocks 910 and 920 are coupled via wires passing over block 930. Block 930 includes flyover routing channel box 940 through which a global router connects blocks 910 and 920. As discussed above, flyover routing channel box 940 may be blocked for block-level routing.

Figure 10:
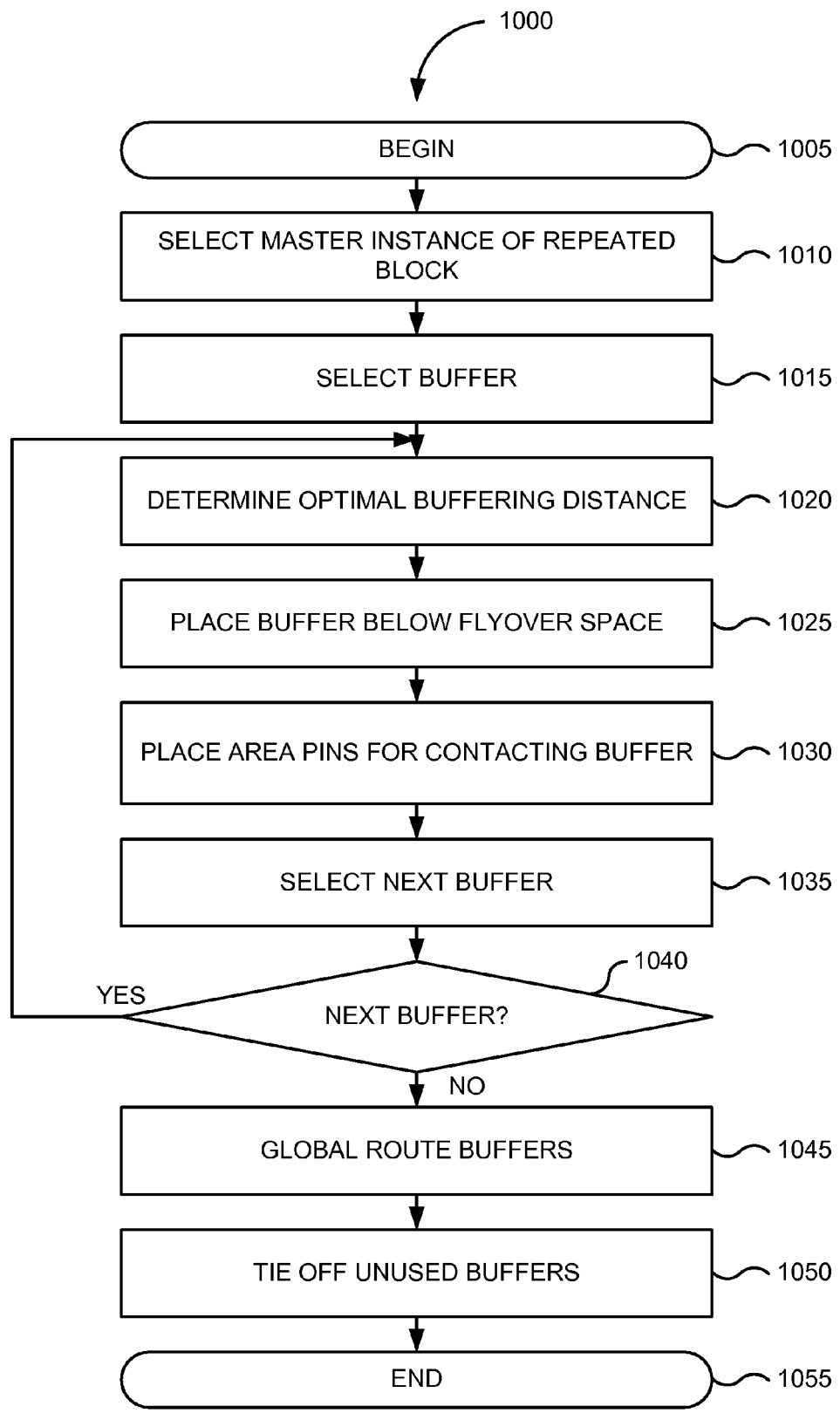
FIG. 10 is a flowchart of a method for buffer insertion for repeated blocks in one embodiment according to the present invention.

FIG. 10 is a flowchart of a method for buffer insertion for repeated blocks in one embodiment according to the present invention. FIG. 10 begins in step 1005.

In step 1010, a master instance of a repeated block is selected. The master instance may be the master instance chosen according to the repeated block pin placement analysis and/or block flyover implementation of FIGS. 5 and 6. Alternatively, the master instance may be chosen arbitrarily.

In step 1015, a buffer is selected. In step 1020, an optimal buffering distance is determined. The optimal placement of buffers along globally routed wires may be chosen based on, for example, a technology library. In step 1025, the selected buffer is placed below the flyover space. In various embodiments, incremental placement techniques can be utilized to insert needed buffers within the repeated block flyover space. Other obstructions, beyond those identified during flyover implementation, such as obstructions at lower levels, may be avoided during buffer insertion.

In step 1030, area pins are placed for contacting buffers. Area pins may be placed on the upper two layers of metal above the buffers for contacting the buffer I/O. In step 1035, the next buffer is selected, if any remain. In step 1040, a determination is made whether to insert the next buffer. If another buffer should be inserted, the processing continues in step 1020 for the next selected buffer and for all buffers for all repeated block instances.

If no additional buffers are to be inserted, in step 1045, the buffers are globally routed. To wire the chip, the global router may connect to buffers in each repeated block instance as needed. Any buffers which were not needed or unused in a given repeated block instance are tied off in step 1050.

In some embodiments, these buffers may be for a different power supply voltage than that which powers the repeated block. These differing voltage buffers are sometimes referred to as "gas stations." FIG. 10 ends in step 1055.

Figure 11:
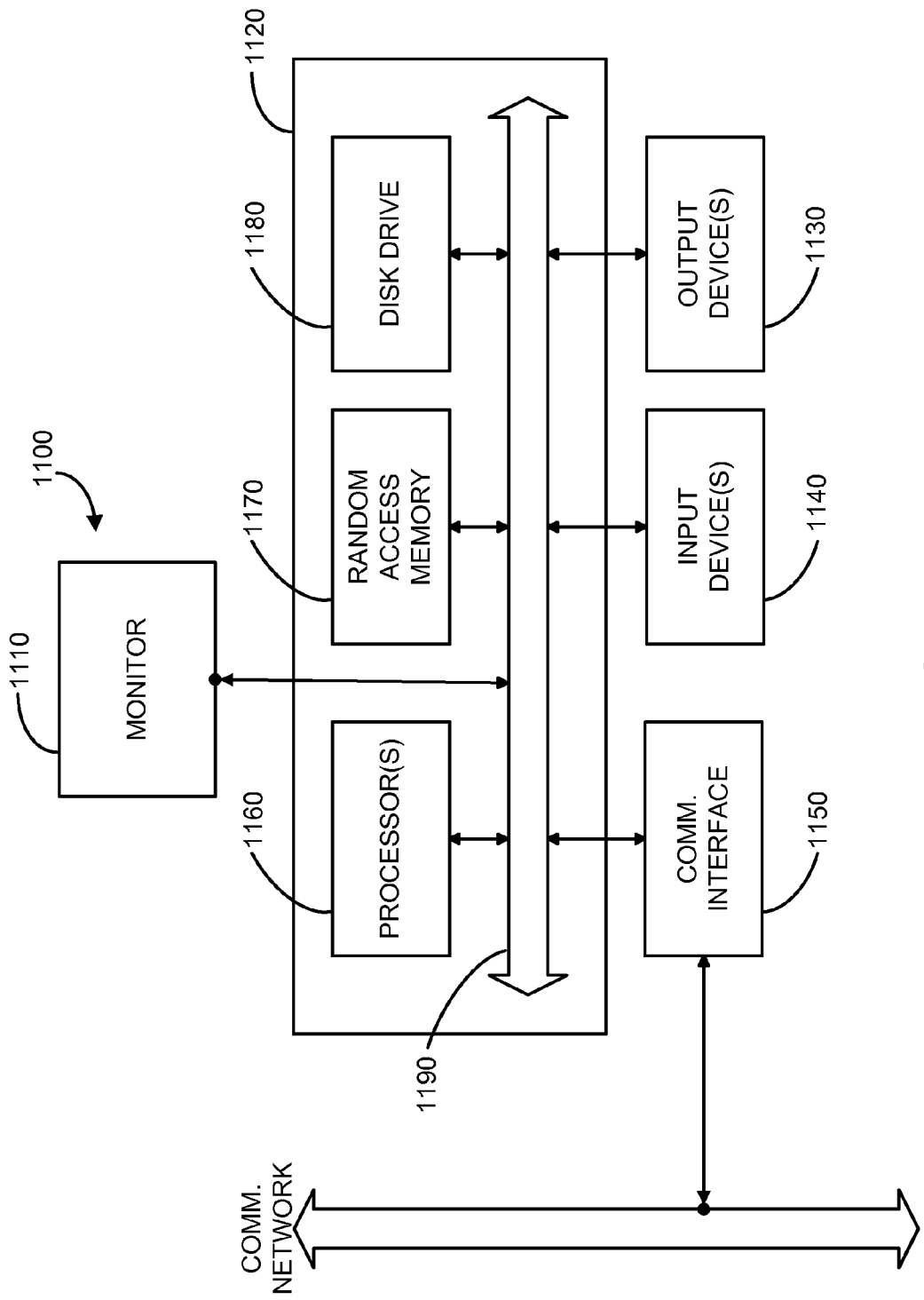
FIG. 11 is a block diagram of a computer system that may incorporate embodiments of the present invention.

FIG. 11 is a simplified block diagram of a computer system that may incorporate embodiments of the present invention. FIG. 11 is merely illustrative of an embodiment incorporating the present invention and does not limit the scope of the invention as recited in the claims. One of ordinary skill in the art would recognize other variations, modifications, and alternatives.

In one embodiment, computer system 1100 typically includes a monitor 1110, a computer 1120, user output devices 1130, user input devices 1140, communications interface 1150, and the like.

As shown in FIG. 11, computer 1120 may include a processor(s) 1160 that communicates with a number of peripheral devices via a bus subsystem 1190. These peripheral devices may include user output devices 1130, user input devices 1140, communications interface 1150, and a storage subsystem, such as random access memory (RAM) 1170 and disk drive 1180.

User input devices 1130 include all possible types of devices and mechanisms for inputting information to computer system 1120. These may include a keyboard, a keypad, a touch screen incorporated into the display, audio input devices such as voice recognition systems, microphones, and other types of input devices. In various embodiments, user input devices 1130 are typically embodied as a computer mouse, a trackball, a track pad, a joystick, wireless remote, drawing tablet, voice command system, eye tracking system, and the like. User input devices 1130 typically allow a user to select objects, icons, text and the like that appear on the monitor 1110 via a command such as a click of a button or the like.

User output devices 1140 include all possible types of devices and mechanisms for outputting information from computer 1120. These may include a display (e.g., monitor 1110), non-visual displays such as audio output devices, etc.

Communications interface 1150 provides an interface to other communication networks and devices. Communications interface 1150 may serve as an interface for receiving data from and transmitting data to other systems. Embodiments of communications interface 1150 typically include an Ethernet card, a modem (telephone, satellite, cable, ISDN), (asynchronous) digital subscriber line (DSL) unit, FireWire interface, USB interface, and the like. For example, communications interface 1150 may be coupled to a computer network, to a FireWire bus, or the like. In other embodiments, communications interfaces 1150 may be physically integrated on the motherboard of computer 1120, and may be a software program, such as soft DSL, or the like.

In various embodiments, computer system 1100 may also include software that enables communications over a network such as the HTTP, TCP/IP, RTP/RTSP protocols, and the like. In alternative embodiments of the present invention, other communications software and transfer protocols may also be used, for example IPX, UDP or the like.

In some embodiment, computer 1120 includes one or more Xeon microprocessors from Intel as processor(s) 1160. Further, one embodiment, computer 1120 includes a UNIX-based operating system.

RAM 1170 and disk drive 1180 are examples of tangible media configured to store data such as embodiments of the present invention, including executable computer code, human readable code, or the like. Other types of tangible media include floppy disks, removable hard disks, optical storage media such as CD-ROMS, DVDs and bar codes, semiconductor memories such as flash memories, read-only-memories (ROMS), battery-backed volatile memories, networked storage devices, and the like. RAM 1170 and disk drive 1180 may be configured to store the basic programming and data constructs that provide the functionality of the present invention.

Software code modules and instructions that provide the functionality of the present invention may be stored in RAM 1170 and disk drive 1180. These software modules may be executed by processor(s) 1160. RAM 1170 and disk drive 1180 may also provide a repository for storing data used in accordance with the present invention.

RAM 1170 and disk drive 1180 may include a number of memories including a main random access memory (RAM) for storage of instructions and data during program execution and a read only memory (ROM) in which fixed instructions are stored. RAM 1170 and disk drive 1180 may include a file storage subsystem providing persistent (non-volatile) storage for program and data files. RAM 1170 and disk drive 1180 may also include removable storage systems, such as removable flash memory.

Bus subsystem 1190 provides a mechanism for letting the various components and subsystems of computer 1120 communicate with each other as intended. Although bus subsystem 1190 is shown schematically as a single bus, alternative embodiments of the bus subsystem may utilize multiple busses.

FIG. 11 is representative of a computer system capable of embodying the present invention. It will be readily apparent to one of ordinary skill in the art that many other hardware and software configurations are suitable for use with the present invention. For example, the computer may be a desktop, portable, rack-mounted or tablet configuration. Additionally, the computer may be a series of networked computers. Further, the use of other micro processors are contemplated, such as Pentium™ or Itanium™ microprocessors; Opteron™ or AthlonXP™ microprocessors from Advanced Micro Devices, Inc; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present invention can be implemented in the form of logic in software or hardware or a combination of both. The logic may be stored in a computer readable or machine-readable storage medium as a set of instructions adapted to direct a processor of a computer system to perform a set of steps disclosed in embodiments of the present invention. The logic may form part of a computer program product adapted to direct an information-processing device to perform a set of steps disclosed in embodiments of the present invention. Based on the disclosure and teachings provided herein, a person of ordinary skill in the art will appreciate other ways and/or methods to implement the present invention.

The specification and drawings are, accordingly, to be regarded in an illustrative rather than a restrictive sense. It will, however, be evident that various modifications and changes may be made thereunto without departing from the broader spirit and scope of the invention as set forth in the claims. In addition, the technique and system of the present invention is suitable for use with a wide variety of EDA tools and methodologies for designing, testing, and/or manufacturing integrated circuits or other electronic devices. The scope of the invention should, therefore, be determined not with reference to the above description, but instead should be determined with reference to the pending claims along with their full scope or equivalents.

What is claimed is:

1. A computer-implemented method for designing an integrated circuit, the method comprising:

identifying, with one or more processors associated with one or more computer systems, one or more instances of a repeated block within the integrated circuit;

shaping layout, with the one or more processors associated with the one or more computer systems, for each instance of a repeated block;

performing, with the one or more processors associated with the one or more computer systems, repeated block placement on the one or more instances of a repeated block;

performing, with the one or more processors associated with the one or more computer systems, repeated block flyover implementation in the layout for each instance of a repeated block such that flyovers for each instance of a repeated block accommodate global routing requirements; and performing, with the one or more processors associated with the one or more computer systems, repeated block buffer insertion.

2. The method of claim 1 wherein shaping each instance of a repeated block comprises shaping the layout for one or more instances of a repeated block to be substantially identical.

3. The method of claim 1 wherein performing repeated block placement on the one or more instances of a repeated block comprises:

identifying a set of nodes contacted by an I/O associated with the one or more instances of a repeated block;

determining a minimum spanning tree based on superimposed nodes; and determining placement of an I/O pin for the I/O based on the minimum spanning tree.

4. The method of claim 1 wherein performing repeated block flyover implementation comprises:

reserving a set of flyover blockages over the layout for each instance of a repeated block based on the global routing requirements associated with the one or more instances of a repeated block; and pushing the set of flyover blockages into the layout for each instance of a repeated block; and further comprising:

global routing through the set of flyover blockages associated with the one or more instances of a repeated block.

5. The method of claim 1 wherein performing repeated block buffer insertion comprises:

determining buffering distance along a globally routed wire;

placing a set of buffers within a flyover space associated with an instance of a repeated block in response to global routing requirements associated with the one or more instances of a repeated block; and wiring to the set of buffers using a global router.

6. The method of claim 1 further comprising:

performing a rough global placement of the integrated circuit.

7. A non-transitory computer-readable medium storing a set of code modules which when executed by a processor of a computer system become operational with the processor for designing an integrated circuit, the non-transitory computer readable medium comprising:

code for identifying one or more instances of a repeated block within the integrated circuit;

code for shaping layout for each instance of a repeated block;

code for performing repeated block placement on the one or more instances of a repeated block;

code for performing repeated block flyover implementation such that flyovers for each instance of a repeated block accommodate global routing requirements; and code for performing repeated block buffer insertion.

8. The non-transitory computer-readable medium of claim 7 wherein the code for shaping each instance of a repeated block comprises code for shaping the layout for the one or more instances of a repeated block to be substantially identical.

9. The non-transitory computer-readable medium of claim 7 wherein the code for performing repeated block placement on the one or more instances of a repeated block comprises:
   code for identifying a set of nodes contacted by an I/O associated with the one or more instances of a repeated block;
   code for determining a minimum spanning tree based on superimposed nodes; and
   code for determining placement of an I/O pin for the I/O based on the minimum spanning tree.

10. The non-transitory computer-readable medium of claim 7 wherein the code for performing repeated block flyover implementation comprises:
   code for reserving a set of flyover blockages over the layout for each instance of a repeated block based on the global routing requirements associated with the one or more instances of a repeated block; and
   code for pushing the set of flyover blockages into each instance of a repeated block; and further comprising:
   code for global routing through the set of flyover blockages associated with the one or more instances of a repeated block.

11. The non-transitory computer-readable medium of claim 7 wherein the code for performing repeated block buffer insertion comprises:
   code for determining buffering distance along a globally routed wire;
   code for placing a set of buffers within a flyover space associated with an instance of a repeated block in response to global routing requirements associated with the one or more instances of a repeated block; and
   code for wiring to the set of buffers using a global router.

12. The non-transitory computer-readable medium of claim 7 further comprising:
   code for performing a rough global placement of the integrated circuit.

13. A system for designing an integrated circuit, the system comprising:
   a processor; and
   a memory coupled to the processor, the memory configured to store a set of instructions which when executed by the processor become operational with the processor to:
   identify one or more instances of a repeated block within the integrated circuit;
   shape layout for each instance of a repeated block;
   perform repeated block placement on the one or more instances of a repeated block;
   perform repeated block flyover implementation such that flyovers for each instance of a repeated block accommodate global routing requirements; and
   perform repeated block buffer insertion.

14. The system of claim 13 wherein to shape each instance of a repeated block the set of instructions become operation with the processor to shape the one or more instances of a repeated block to be substantially identical.

15. The system of claim 13 wherein to perform repeated block placement on the one or more instances of a repeated block the set of instructions become operation with the processor to:
   identify a set of nodes contacted by an I/O associated with the one or more instances of a repeated block;
   determine a minimum spanning tree based on superimposed nodes; and
   determine placement of an I/O pin for the I/O based on the minimum spanning tree.

16. The system of claim 13 wherein to perform repeated block flyover implementation the set of instructions become operation with the processor to:
   reserve a set of flyover blockages over the layout for each instance of a repeated block based on the global routing requirements associated with the one or more instances of a repeated block;
   push the set of flyover blockages into each instance of a repeated block; and
   global route through the set of flyover blockages associated with the one or more instances of a repeated block.

17. The system of claim 13 wherein to perform repeated block buffer insertion the set of instructions become operation with the processor to:
   determine buffering distance along a globally routed wire;
   place a set of buffers within a flyover space associated with an instance of a
   repeated block in response to global routing requirements associated with the one or more instances of a repeated block; and
   wire to the set of buffers using a global router.

18. The system of claim 13 the set of instructions further become operation with the processor to:
   perform a rough global placement of the integrated circuit.

\* \* \* \* \*

UNITED STATES PATENT AND TRADEMARK OFFICE
CERTIFICATE OF CORRECTION

PATENT NO. : 8,407,650 B1  
APPLICATION NO. : 12/129916  
DATED : March 26, 2013  
INVENTOR(S) : Jacob Avidan et al.

Page 1 of 1

It is certified that error appears in the above-identified patent and that said Letters Patent is hereby corrected as shown below:

Title Page, at item (73) Assignee, delete "Synopsis" and insert -- Synopsys --.

Signed and Sealed this  
Twenty-sixth Day of November, 2013

Margaret A. Focarino  
*Commissioner for Patents of the United States Patent and Trademark Office*